(12) United States Patent
Kong et al.

(10) Patent No.: US 10,539,736 B2
(45) Date of Patent: Jan. 21, 2020

(54) LIGHT SOURCE MODULE AND BACKLIGHT UNIT INCLUDING THE SAME

(71) Applicant: LG DISPLAY CO., LTD., Seoul (KR)

(72) Inventors: Chang Kyeong Kong, Paju-si (KR); Young Min Kweon, Paju-si (KR); Jinho Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 98 days.

(21) Appl. No.: 15/661,898

(22) Filed: Jul. 27, 2017

(65) Prior Publication Data
US 2018/0031759 A1   Feb. 1, 2018

(30) Foreign Application Priority Data

Jul. 29, 2016  (KR) .................. 10-2016-0097507

(51) Int. Cl.
*F21V 8/00* (2006.01)
*H01L 33/50* (2010.01)
*H01L 33/60* (2010.01)

(52) U.S. Cl.
CPC ......... *G02B 6/0073* (2013.01); *G02B 6/0068* (2013.01); *H01L 33/502* (2013.01); *H01L 33/507* (2013.01); *H01L 33/60* (2013.01); *H01L 2933/0041* (2013.01)

(58) Field of Classification Search
USPC .................................. 362/611–634
See application file for complete search history.

(56) References Cited

U.S. PATENT DOCUMENTS

2011/0267799 A1* 11/2011 Epstein ............... G02B 3/0056
                                                  362/19
2015/0247608 A1*  9/2015 Monch .................... H01L 33/54
                                                  362/235

* cited by examiner

*Primary Examiner* — Matthew Mikels
(74) *Attorney, Agent, or Firm* — Seed Intellectual Property Law Group LLP (57) ABSTRACT

The present disclosure provides a light source module that includes a substrate, a plurality of light barriers on a surface of the substrate and spaced apart from each other, a plurality of light source packages on the surface of the substrate and positioned between the plurality of light barriers, and a total-reflection induction layer on the plurality of light source packages. The total-reflection induction layer has a flat surface opposite the plurality of light source packages. According to the various embodiments provided herein, the amount of light incident on a light guide plate increases, and a heat radiation effect is improved.

22 Claims, 8 Drawing Sheets

LIGHT SOURCE MODULE AND BACKLIGHT UNIT INCLUDING THE SAME

CROSS REFERENCE TO RELATED APPLICATION

This application claims priority from Korean Patent Application No. 10-2016-0097507, filed on Jul. 29, 2016, which is hereby incorporated by reference for all purposes as if fully set forth herein.

BACKGROUND

Technical Field

The present disclosure is generally directed to light source modules and backlight units including the same.

Description of the Related Art

In general, a liquid crystal display (LCD) is a kind of flat panel display, which displays images using electrical and optical characteristics of a liquid crystal that has physical characteristics between a liquid and a solid. The liquid crystal display is thin and light compared to other displays, and is widely used in many industries with various applications thanks to low power consumption and low driving voltage.

Meanwhile, the liquid crystal display requires a separate light source because it is a non-light-emitting device that emits light by means of external components. Accordingly, a backlight unit having a light source is provided on the back surface of the liquid crystal panel to emit light toward the entire surface of the liquid crystal display, and the light is diffused by passing through a plurality of optical sheets to then be collected on the liquid crystal panel, thereby implementing visible images.

Generally, backlight units of a liquid crystal display are divided into an edge type and a direct type depending on the arrangement of light-emitting lamps that are used as a light source.

In the direct type of backlight unit, a plurality of lamps are arranged in a row on the back surface of a liquid crystal panel to directly emit light to the entire surface of the liquid crystal panel. In the edge type, a light source is installed outside a light guide plate for guiding light, and the light emitted from the light source is incident on the entire surface of the liquid crystal panel using the light guide plate.

Meanwhile, an LED is mainly used as a light source for providing light to the light guide plate, and the backlight unit adopts a plurality of LED packages. With this LED package, the LED lamps have a light distribution in the form of a point light source. The light in the form of a point light source is converted into light in the form of a planar light source by means of the light guide plate to then be emitted.

The point light source of the LED lamps may cause non-uniformity in the amount of light incident on one side of the light guide plate. That is, the amount of light incident on the light guide plate area immediately adjacent to the LED packages becomes greater than the amount of light incident on the light guide plate area between the LED packages. As a result, a hot-spot phenomenon may occur in which some areas of the backlight are bright and some other areas thereof are dark.

In addition, the number of LEDs may be increased in order to increase the amount of light incident on the light guide plate. However, in this case, heat generated from the LEDs may cause problems, and an increase in the number of LEDs may cause an increase in the cost.

BRIEF SUMMARY

In order to solve the above-described problems, the present embodiments provide a light source module that increases the amount of light incident on a light guide plate from a light source by utilizing a total-reflection induction layer having a flat upper surface and that has a superior heat radiation effect, and further provide a backlight unit including the same.

In one or more embodiments, the present disclosure provides a light source module including a substrate having a surface. In addition, the light source module includes a plurality of light barriers on the surface of the substrate and spaced apart from each other. The light source module further includes a plurality of light source packages on the surface of the substrate and positioned between the plurality of light barriers. Further, the light source module includes a total-reflection induction layer on the plurality of light source packages, the total-reflection induction layer having a flat surface opposite the plurality of light source packages.

In another embodiment, the present disclosure provides a backlight unit including a light source module that includes: a substrate having a surface; a plurality of light barriers on the surface of the substrate and spaced apart from each other; a plurality of light source packages positioned between the plurality of light barriers; and a total-reflection induction layer on the plurality of light source packages, the total-reflection induction layer having a flat surface opposite the plurality of light source packages. In addition, the backlight unit includes a light guide plate positioned adjacent to the flat surface of the total-reflection layer, and a receiving member that receives the light source module and the light guide plate.

The light source module and the backlight unit including the same according to the present embodiments can improve the light incident efficiency by totally reflecting light that is not incident on the light guide plate among the light emitted from a light source by the total-reflection induction layer in order to thereby change a path of the light toward the light guide plate, thereby reducing the number of light sources that are needed to provide a sufficient amount of light through the light guide plate.

In addition, the light source module and the backlight unit including the same according to the present embodiments have an effect of improving the heat radiation effect by disposing the total-reflection induction layer on the light source package including a light source.

BRIEF DESCRIPTION OF THE DRAWINGS

The above and other objects, features, and advantages of the present disclosure will be more apparent from the following detailed description taken in conjunction with the accompanying drawings, in which.

DETAILED DESCRIPTION OF THE EXEMPLARY EMBODIMENTS

Hereinafter, embodiments of the present disclosure will be described in detail with reference to the accompanying drawings. The following embodiments are provided, by way of example, so that the idea of the present disclosure can be sufficiently understood by those skilled in the relevant art. Therefore, the present disclosure is not limited to the embodiments as described below, and may be embodied in other forms. Also, in the drawings, the size, thickness, and the like of a device may be exaggeratedly represented for the convenience of description. Throughout the specification, the same reference numerals designate the same elements.

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure, and the present disclosure is defined only by the scope of the appended claims. Throughout the specification, the same or like reference numerals designate the same or like elements. In the drawings, the dimensions and relative sizes of layers and regions may be exaggerated for the convenience of description.

When an element or layer is referred to as being "above" or "on" another element, it can be "directly above" or "directly on" the other element or layer or intervening elements or layers may be present. In contrast, when an element is referred to as being "directly on" or "directly above" another element or layer, there are no intervening elements or layers present.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the element in use or operation in addition to the orientation depicted in the figures. For example, if the element in the figures is turned over, elements described as "below" or "beneath" other elements would then be oriented "above" the other elements. Thus, the exemplary term "below" can encompass both an orientation of above and below.

In addition, terms, such as first, second, A, B, (a), (b) or the like may be used herein when describing components of the present disclosure. Each of these terminologies is not used to define an essence, order or sequence of a corresponding component but is used merely to distinguish the corresponding component from other component(s). In the case that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

The terms as used herein are merely for the purpose of describing embodiments and are not intended to limit the present disclosure. As used herein, singular forms are intended to include plural forms unless the context clearly indicates otherwise. The terms "comprises" and/or "comprising" as used herein refer to the existence of a disclosed component, step, operation, and/or element, and do not exclude the existence of or a possibility of addition of one or more other components, steps, operations, and/or elements.

Hereinafter, embodiments of the present disclosure will be described in more detail with reference to the accompanying drawings.

Figure 1:
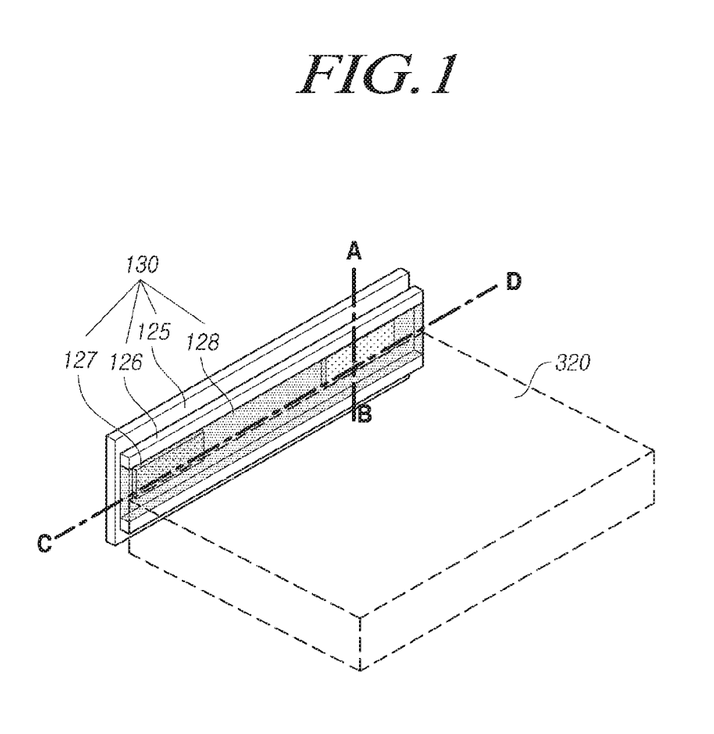
FIG. 1 is a perspective view of a light source module and a light guide plate according to one or more embodiments of the present disclosure.
Figure 2:
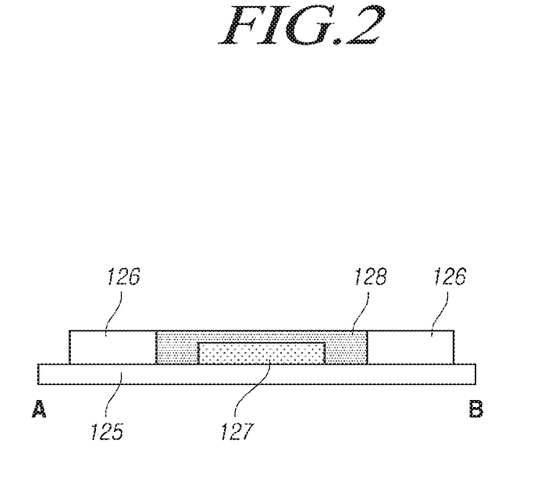
FIG. 2 is a cross-sectional view taken along the line A-B of FIG. 1.

FIG. 1 is a perspective view of a light source module and a light guide plate according to the present embodiment, and FIG. 2 is a cross-sectional view taken along the line A-B of FIG. 1.

First, referring to FIG. 1, a light source module 130 according to the present embodiment includes a substrate 125, a plurality of light barriers 126, a light source package 127, and a total-reflection induction layer 128. The light barriers 126 are also referred to herein, alternatively, as dams 126.

More specifically, the substrate 125 may include a printed circuit board (PCB), which may include at least one of a metal core PCB (MCPCB), a flexible PCB (FPCB), a resin PCB, or a ceramic PCB. In addition, a plurality of dams 126 according to one or more embodiments are disposed to face each other on one surface of the substrate 125. That is, the plurality of dams 126 may include first and second dams 126 that are spaced apart from each other on the substrate 125, as shown. A plurality of light source packages 127 may be disposed on the substrate 125, and may be disposed between the plurality of dams 126. In addition, the total-reflection induction layer 128 may be disposed on the plurality of light source packages 127. A surface of the total-reflection induction layer 128 may be flat. For example, the surface of the total-reflection induction layer 128 that is opposite the light source packages 127, and that faces the light guide plate 320, may be flat.

A light guide plate 320 may be disposed on one side of the light source module 130. The light guide plate 320 may serve to emit light incident from a light source.

Meanwhile, the light source module of the backlight unit that provides light to a liquid crystal display may include one or more light source packages and printed circuit boards. In addition, the light source module may be mounted in a housing. The housing plays a role of protecting the light source module and of irradiating heat generated by the light source module.

In order to allow the light emitted from the above-described light source module to be incident on the light guide plate, the light source module should be disposed adjacent to the light guide plate. Typically, the light guide plate and the light source module may be disposed to be spaced apart from each other in order to prevent damage to the light source package due to a mechanical collision between the light guide plate and the light source module.

However, when the light guide plate and the light source module are spaced apart from each other, the light emitted from the light source module may not be completely incident on the light guide plate due to a distance between the light guide plate and the light source module. That is, some of the light emitted from the light source module leaks through a space between the light guide plate and the light source module, thereby degrading the light incident efficiency.

The number of light source packages may be increased in order to solve this problem, but additional heat may be generated from the increased number of light source packages, which thus presents another problem.

Meanwhile, the unit price of the backlight unit increases with an increase in the number of the light source packages. To solve this problem, the number of light source packages may be reduced. However, in this case, a distance between adjacent light source packages increases, so that the light is not properly guided by the light guide plate, thereby increasing the degree of hot spot.

The light source module according to one or more embodiments of the present disclosure overcomes the above-mentioned problems. The light source module 130 according to the present embodiments may include a plurality of dams 126, a light source package 127, and a total-reflection induction layer 128, and may be disposed to come into contact with the light guide plate 320 as shown in FIG. 1. As described above, since the light source module 130 and the light guide plate 320 are disposed to be in contact with each other, the light emitted from the light source package 127 may be directly incident on the light guide plate 320, thereby improving the light incident efficiency.

More specifically, the light source module 130 according to one or more embodiments has a plurality of dams 126 that are disposed to be spaced apart from each other on one surface of the substrate 125. For example, as shown in FIGS. 1 and 2, the light source module 130 may include two dams 126 that are disposed to be spaced apart from each other on the substrate 125. At this time, the plurality of dams 126 may be formed in a bar shape, but the present embodiments are not limited thereto.

The plurality of dams 126 may be made of a white organic material that reflects incident light. For example, the plurality of dams 126 may be made of at least one of polycarbonate (PC), polyethylene naphthalate (PEN), polyimide (PI), polyethersulfone (PES), polyethylene terephthalate (PET), polymethyl methacrylate (PMMA), or polystyrene (PS).

Accordingly, portions of the light emitted from the light source package 127 that is emitted toward the plurality of dams 126 may be reflected by the plurality of dams 126 without being absorbed by the plurality of dams 126, and may be directed to the light guide plate 320. That is, since the plurality of dams 126 are made of white organic materials, the light can be reflected toward the light guide plate 320, thereby improving the light incident efficiency.

Meanwhile, since the plurality of dams 126 according to one or more embodiments are disposed to be spaced apart from each other, a space is formed between the plurality of dams 126. A plurality of light source packages 127 may be disposed to be spaced apart from each other within the space between the dams 126. In one or more embodiments, the plurality of light source packages 127 may be spaced from one another with an equal distance therebetween, however, embodiments of the present disclosure are not limited thereto.

Figure 3:
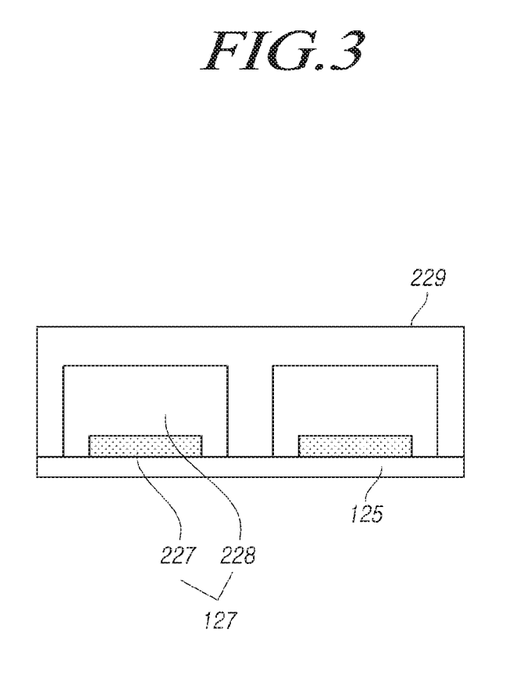
FIG. 3 is a cross-sectional view illustrating a light source package according to one or more embodiments.

FIG. 3 is a cross-sectional view illustrating a light source package according to the present embodiment.

Referring to FIG. 3, the light source package according to one or more embodiments includes a substrate 125, a plurality of light sources 227, phosphor layers 228, and a light incident portion 229.

More specifically, a plurality of light sources 227 are arranged on the substrate 125. For example, the plurality of light sources 227 according to one or more embodiments may be light-emitting diode chips, but the type of light source 227 according to the present embodiments is not limited thereto, and any configuration for emitting light to the light guide plate can be adopted.

In addition, the light source package 127 according to one or more embodiments includes phosphor layers 228 disposed to surround the respective light sources 227. That is, the light sources 227 may be sealed by the phosphor layers 228. Each of the light sources 227 may be surrounded by a respective phosphor layer 228. In other words, one phosphor layer 228 may be disposed so as to surround one light source 227.

The phosphor layers 228 may include phosphors for converting the wavelength of light emitted from the light source 227 in a clear resin material, such as silicon or epoxy. In this case, the phosphor layers 228 may selectively include YAG-based phosphors, TAG-based phosphors, silicate-based phosphors, nitride-based phosphors, or oxynitride-based phosphors. In addition, the phosphors may include at least one of red phosphors, yellow phosphors, or green phosphors, but the phosphor layers 228 according to the present embodiments are not limited thereto.

As described above, the phosphor layers 228 are arranged to surround the respective light sources 227, thereby converting light emitted from the light source 227 into light having a desired wavelength.

Meanwhile, although the phosphor layers 228 are illustrated in a hexahedron shape to surround the respective light sources 227 in FIG. 3, the shape of the phosphor layer 228 according to the present embodiments is not limited thereto. For example, the phosphor layer 228 may have a shape of a semi-oval sphere so as to surround the light source 227.

Although the upper surface of the light incident portion 229 of the light source package is illustrated to be flat in FIG. 3, the present embodiments are not limited thereto, and the upper surface of the light incident surface 229 may be formed in a concave or convex curved shape.

Referring to FIGS. 1 and 2, a total-reflection induction layer 128 is disposed on the plurality of light source packages 127. More specifically, the total-reflection induction layer 128 may be disposed on the light source packages 127 so as to surround the respective light source packages 127.

Since the total-reflection induction layer 128 is disposed to surround the light source packages 127, heat generated from the light source packages 127 can be radiated through the total-reflection induction layer 128. As described above, since the heat generated from the light source packages 127 is radiated through the total-reflection induction layer 128, it is not necessary to provide a further structure or configuration required for heat radiation. That is, the backlight unit according to the present embodiments may eliminate the additional structures or configuration as may be employed in the conventional backlight unit, such as an LED housing or a thermal pad for radiating the heat generated from the light source packages 127, thereby enabling simplification of the configuration.

The total-reflection induction layer 128 may include at least one layer made of a clear organic material. The clear organic material included in the total-reflection induction layer 128 may be an optical clear adhesive or an optical clear resin.

In this case, since the total-reflection induction layer 128 is made of at least one layer of a clear organic material (particularly, an optical clear adhesive or an optical clear resin), the light emitted from the light source package 127 may be incident on the light guide plate 320 without loss.

In addition, the total-reflection induction layer 128 may be disposed to fill the space between the plurality of dams 126, and the upper surface thereof may be flat. As used herein, the "upper surface" of the total-reflection induction layer 128 refers to the surface that faces the light guide plate 320, and no particular direction or orientation is intended thereby. The upper surface of the total-reflection induction layer 128 may be disposed to come into contact with at least one side surface of the light guide plate 320. Because the upper surface of the total-reflection induction layer 128 is flat, there is no gap, or substantially no gap, between the total-reflection induction layer 128 and the light guide plate 320. This prevents optical losses as all or substantially all of the light emitted from the light source packages 127 may be directed through the total-reflection induction layer 128 and into the side surface of the light guide plate 320, which contacts the total-reflection induction layer 128.

Meanwhile, if there is a space between the total-reflection induction layer 128 and the light guide plate 320, the light emitted from the light source package 127 may leak through the space and may be lost without being incident on the light guide plate 320. However, the structure described above can reduce the quantity of lost light. In other words, since the total-reflection induction layer 128 and the light guide plate 320 are disposed in contact with each, the light emitted from the light source package 127 may be directly incident on the light guide plate 320 in order to thereby reduce the amount of light that is lost without being incident on the light guide plate 320.

Figure 4:
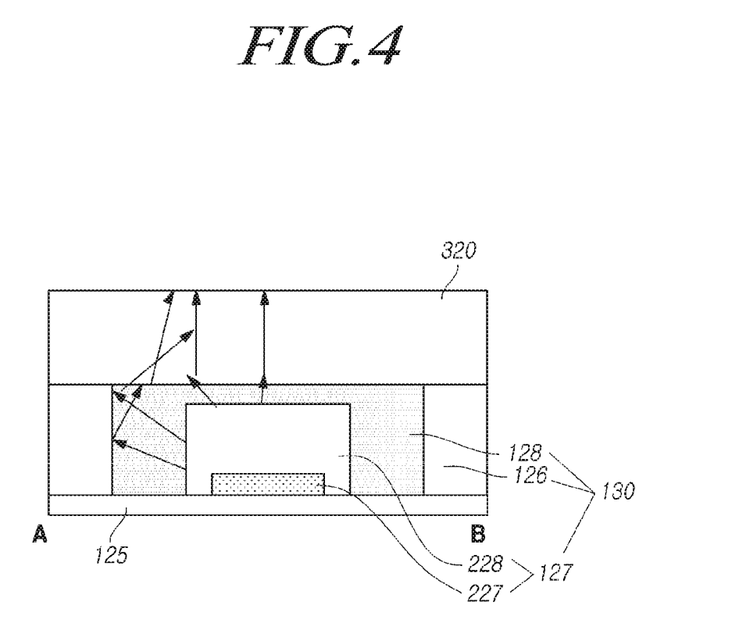
FIG. 4 is a cross-sectional view taken along the line A-B of FIG. 1 illustrating a path through which light emitted from the light source module is incident on a light guide plate.
Figure 5:
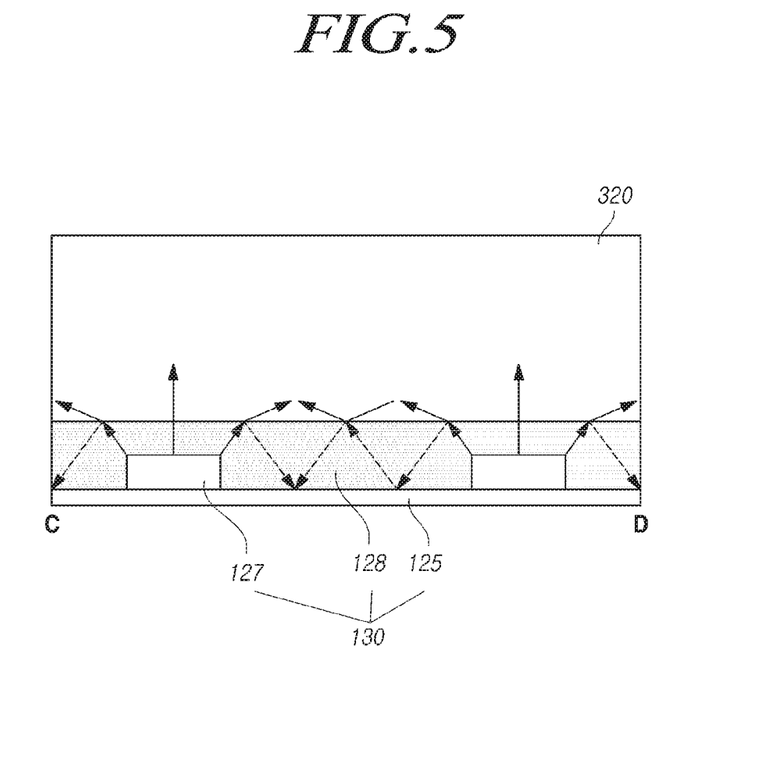
FIG. 5 is a cross-sectional view, taken along the line C-D of FIG. 1, illustrating a path through which light emitted from the light source module is incident on a light guide plate.

A path through which the light emitted from the light source module according to the present embodiments is incident on the light guide plate will be described in further detail below. FIGS. 4 and 5 show a path through which light emitted from the light source module according to the present embodiments is incident on the light guide plate.

FIG. 4 is a view illustrating a path through which light emitted from the light source module according to the present embodiments is incident on the light guide plate in the cross-sectional state taken along the line A-B of FIG. 1, and FIG. 5 is a view illustrating a path through which light emitted from the light source module according to the present embodiments is incident on the light guide plate in the cross-sectional state taken along the line C-D of FIG. 1.

First, referring to FIG. 4, some of the light emitted from the light source package 127 of the light source module 130 according to the present embodiments reaches the dams 126 disposed on the substrate 125. More specifically, some of the light emitted from the light source package 127 reaches the dams 126 via the total-reflection induction layer 128.

As described above, the dams 126 may be made of white organic materials that reflect light. As a result, the light that reaches the dams 126 may be mostly reflected by the dams 126, and the light is thus changed in its path. More specifically, most of the light reaching the dams 126 through the total-reflection induction layer 128 is reflected to then be incident on the light guide plate 320.

That is, in the case of using the light source module 130 according to the present embodiments, it is possible to improve the amount of light incident on the light guide plate 320 by reflecting the light reaching the dam 126 toward the light guide plate 320.

Meanwhile, although the total-reflection induction layer 128 and the dam 126 are illustrated to have the same height in FIG. 4, the present embodiment is not limited thereto, and the height of the total-reflection induction layer 128 may be less than the height of the dam 126.

When the total-reflection induction layer 128 and the dam 126 are equal in height, or when the height of the total-reflection induction layer 128 is less than the height of the dam 126 as described above, the upper surface of the dam 126 may come into contact with the light guide plate 320 in order to thereby reflect the light directed to the dam 126, among the light emitted from the light source, to then be incident on the light guide plate 320.

In other words, in the case where the dam 126 and the light guide plate 320 are not in contact with each other and have a gap therebetween, light may leak through the gap between the dam 126 and the light guide plate 320. However, in the present embodiments, since the dam 126 and the total-reflection induction layer 128 are equal in height or the height of the total-reflection induction layer 128 is less than the height of the dam 126, light can be totally reflected by the dam 126 to then be incident on the light guide plate 320 without leaking through the dam 126 and the light guide plate 320. This is because there is no gap between the dam 126 and the light guide plate 320 in accordance with embodiments provided herein.

In addition, referring to FIG. 5, some of the light emitted from the light source package 127 of the light source module 130 according to the present embodiments passes through the total-reflection induction layer 128 disposed on the substrate 125 to then be incident on the light guide plate 320.

More specifically, since the refractive index of the total-reflection induction layer 128 is greater than the refractive index of the light guide plate 320, a portion of the light having an incident angle of less than a total-reflection critical angle at a boundary between the total-reflection induction layer 128 and the light guide plate 320, among the light emitted from the light source package 127, may pass through the boundary and into the light guide plate 320.

In addition, another portion of the light having an incident angle greater than a total-reflection critical angle at the boundary between the total-reflection induction layer 128 and the light guide plate 320 may be totally reflected at the boundary between the total-reflection induction layer 128 and the light guide plate 320. The totally reflected light is reflected again by the substrate 125 and redirected to reach the boundary between the total-reflection induction layer 128 and the light guide plate 320 again. At this time, the light having an incident angle of less than the total-reflection critical angle, among the light that has reached the boundary between the total-reflection induction layer 128 and the light guide plate 320, may be incident on the light guide plate 320 and may pass through the boundary and into the light guide plate 320. Here, the light having an incident angle of more than a total-reflection critical angle, among the light that has reached the boundary between the total-reflection induction layer 128 and the light guide plate 320, may be reflected again at the boundary, and may continue along the optical path described above until it is incident on the boundary with an incident angle sufficient to pass through the boundary and into the light guide plate 320.

Accordingly, the light source module 130 and the total-reflection induction layer 128 according to the present embodiments have an effect of improving the light incident efficiency by increasing the amount of light incident on the light guide plate 320 through the total-reflection induction layer 128.

Figure 6:
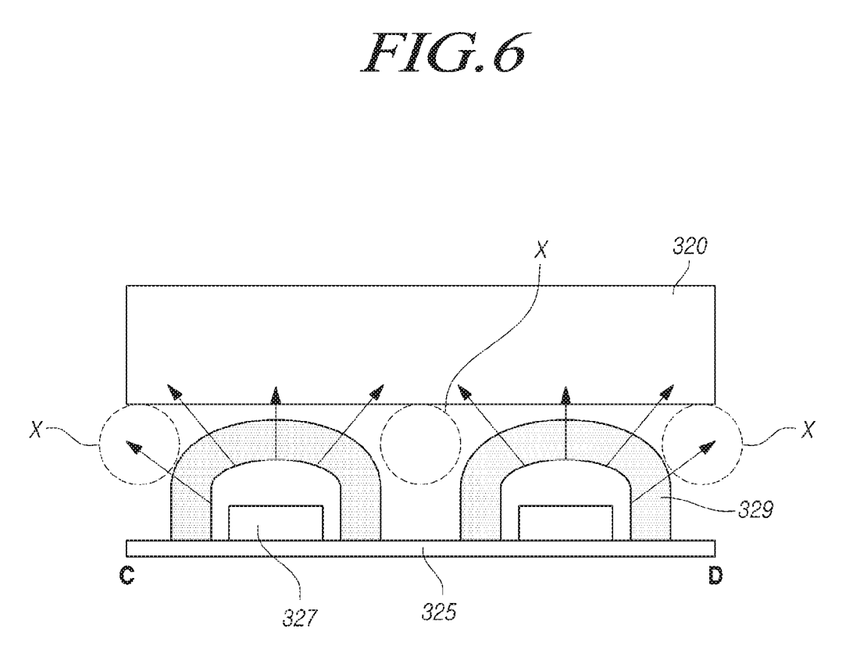
FIG. 6 is a cross-sectional view illustrating an optical module according to a comparative example.

Next, an optical module according to a comparative example will be described with reference to FIG. 6. FIG. 6 is a cross-sectional view illustrating an optical module according to a comparative example. The optical module according to the comparative example may include some of the same components as those of the described herein with respect to one or more embodiments. The same description as in the embodiments described above may be omitted. In addition, the same components will bear the same reference numerals.

Referring to FIG. 6, the optical module according to the comparative example includes a substrate 325, a light-emitting chip 327, and a lens portion 329 surrounding the light-emitting chip 327. Meanwhile, the lens portion 329 of the optical module according to the comparative example may be formed to have a convex curved surface or a concave curved surface.

Therefore, when the lens portion 329 and the light guide plate 320 are brought into contact with each other, a space (X) is formed therebetween. In this case, when an external force is applied to the backlight unit, the light source module may be damaged due to the space (X). The light source module may be damaged as the curved surface of the lens portion 329 provides a very small contact surface, and thus the external force is not distributed, but instead is focused on the point of contact between the curved lens portion 329 and the light guide plate 320.

Meanwhile, in the light source module according to the comparative example, light emitted from the light-emitting chip 327 passes through the phosphor layer and the lens portion 329 in sequence to then be incident on the light guide plate 320. In this case, the light source module according to the comparative example differs from the present embodiments in that the light emitted from the light emitting chip 327 is scattered to the outside of the light source module by the lens portion 329, so that the light leaks without being incident on the light guide plate 320, thereby degrading the light incident efficiency.

Figure 7:
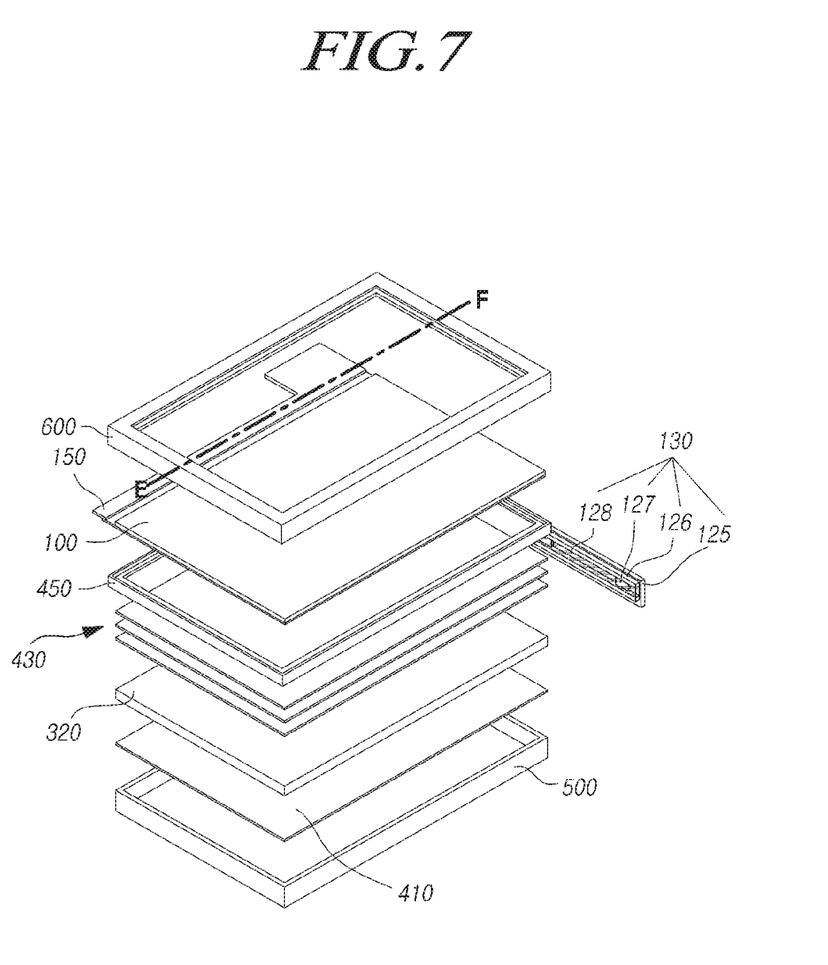
FIG. 7 is an exploded perspective view schematically showing a structure of a display device adopting a backlight unit according to one or more embodiments.
Figure 8:
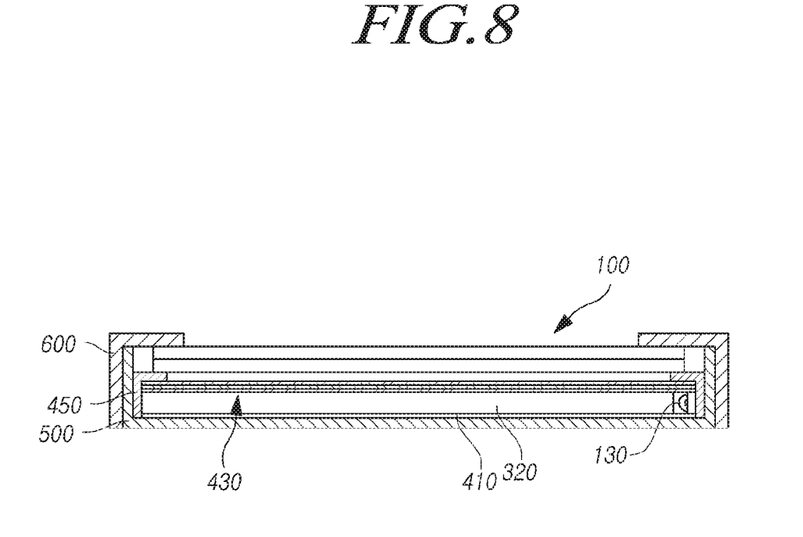
FIG. 8 is a cross-sectional view taken along the line E-F of FIG. 7.

Next, a display device adopting a backlight unit including an optical module according to the present embodiments will be described below with reference to FIGS. 7 and 8. FIG. 7 is an exploded perspective view schematically showing a structure of a display device adopting a backlight unit according to the present embodiment. FIG. 8 is a cross-sectional view taken along the line E-F of FIG. 7

Referring to FIGS. 7 and 8, the display device according to the present embodiments includes a display panel 100, one or more driving units 150 for driving the display panel 100, a backlight unit disposed on the back surface of the display panel 100 to emit light over the entire surface of the display panel 100, and a panel guide 450 for receiving and fixing a position of the display panel 100 and the backlight unit. At this time, one or more driving units 150 may be mounted inside the display panel 100, but the present embodiments are not limited thereto. The panel guide 450 and the cover bottom 500 may be referred to as receiving members for the backlight unit, as the backlight unit including the light source module 130 and the light guide plate 320 may be received by, and fixedly held between, the panel guide 450 and the cover bottom 500.

Meanwhile, the display panel 100 according to the present embodiments may be a liquid crystal display panel, and although it is not shown in the drawing, the display panel 100 may include a color-filter array substrate and a thin-film transistor (TFT) array substrate, which are disposed to face each other, and a liquid crystal layer interposed between the color-filter array substrate and a thin-film transistor array substrate.

A common electrode and a pixel electrode are formed on the display panel 100, in which the color-filter array substrate and the thin-film transistor array substrate are laminated, to apply an electric field to the liquid crystal layer. When a voltage of a data signal applied to the pixel electrode is controlled while applying a voltage to the common electrode, a liquid crystal of the liquid crystal layer rotates due to the dielectric anisotropy depending on the electric field between the common electrode and the pixel electrode to transmit or block light for each pixel, thereby displaying text or images.

In addition, in order to control the voltage of a data signal applied to the pixel electrode for each pixel, switching devices, such as thin film transistors, are provided in the respective pixels. Upper and lower polarizing plates (not shown) may be attached to the outer surfaces of the display panel 100 configured as described above, wherein the lower polarizing plate polarizes the light passing through the backlight unit, and the upper polarizing plate polarizes the light passing through the display panel 100.

According to a specific configuration of the backlight unit, a light source module 130 for emitting light may be provided on at least one side of the light guide plate 320, and a reflection plate 410 may be disposed on a surface of the light guide plate 320, such as a lower surface as shown in the orientation of FIG. 7. In addition, a plurality of optical sheets 430 may be disposed on an upper surface of the light guide plate 320. The display panel 100 is mounted on the upper portion of the backlight unit, which is configured as described above, by means of the panel guide 450. The display panel 100, the panel guide 450, and the backlight unit are fixed in position with respect to one another and held together by a cover bottom 500 in the lower portion and a case top 600 in the upper portion through a fixing member in order to thereby form a display device.

Meanwhile, the plurality of optical sheets 430 may include a diffusion sheet, and upper and lower prism sheets, and may further include a protective sheet. The diffusion sheet disperses light incident from the light guide plate 320 in order to thereby prevent unevenness in the image displayed on the display panel 100, which is caused by a partial concentration of light. In addition, the diffusion sheet vertically refracts the light incident from the light guide plate 320. The upper and lower prism sheets collect light incident from the diffusion sheet to uniformly distribute the same on the entire surface of the display panel 100. In addition, the protective sheet may protect the optical sheets 430 that may be sensitive to dust or scratches, and may prevent the optical sheets 430 from moving when carrying the backlight unit.

In addition, the light source module 130 for providing light to the light guide plate 320 includes a substrate 125, a plurality of dams 126, a light source package 127, a total-reflection induction layer 128, and the like. Meanwhile, the light source module 130 may be disposed in contact with at least one side of the light guide plate 320. According to this, the amount of light leaking without being incident on the light guide plate 320 may be reduced, thereby improving the light incident efficiency.

In addition, the total-reflection induction layer 128 of the light source module 130 is made of a clear organic material and is disposed to surround the light source package 127, thereby improving the heat radiation effect.

The light emitted from the light source module 130 described above is incident on the side surface of the light guide plate 320, and the reflection plate 410 disposed on the back surface of the light guide plate 320 reflects the light directed to the back surface of the light guide plate 320 toward the upper surface of the light guide plate 320 to allow the light to emit toward the display panel 100.

Meanwhile, although FIGS. 7 and 8 show that the light source module 130 is disposed on one side of the light guide plate 320, the present embodiment is not limited thereto, and the light source module 130 may be disposed on at least two sides of the light guide plate 320, or may be disposed on the back surface of the light guide plate 320.

As described above, the light source module 130 according to the present embodiments may reduce the amount of light leaking without being incident on the light guide plate 320, thereby improving the light incident efficiency. In addition, since the light incident efficiency is improved, the number of light sources can be reduced, thereby lowering the unit price of the backlight unit. Further, since the number of light sources is reduced, heat generated during the light emission can be reduced, thereby improving the reliability of the product.

In this case, a distance between adjacent light sources in the light source package 127 becomes greater than a distance between adjacent light sources in a light source package having a greater number of light sources, e.g., in a conventional display device. For example, a distance between adjacent light sources of the light source package 127 according to the present embodiments may be twice the distance between adjacent light sources of a conventional light source package to which the present embodiments are not applied. More specifically, the distance between adjacent light sources of the light source package 127 according to the present embodiments may be in a range from 18 mm to 20 mm, inclusive.

In addition, the total-reflection induction layer 128 of the light source module 130 is made of a clear organic material and is disposed to surround the light source package 127, thereby improving the heat radiation effect.

The features, structures, and effects described in the embodiments above are included in at least one embodiment of the present disclosure, and are not necessarily limited to only one embodiment. Furthermore, the features, structures, and effects illustrated in the embodiments may be executed by combining or modifying the same with respect to other embodiments by those skilled in the art to which the embodiments belong. Accordingly, it should be noted that such combinations and modifications fall within the scope of the present disclosure.

In addition, while the present disclosure has been described with reference to exemplary embodiments thereof, it is clearly understood that the embodiments are only examples by way of illustration and are not intended to limit the present disclosure. Thus, it should be understood that those skilled in the art to which the present disclosure belongs can make a variety of modifications and applications of the present disclosure, which are not described here, without departing from the essential features thereof. For example, the respective components that are shown in detail in the embodiments may be modified to be executed. In addition, differences in relation to the modifications and applications should be construed to be included in the scope of the present disclosure as claimed in the appended claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light source module, comprising:
   a substrate having a surface;
   a plurality of light barriers on the surface of the substrate and spaced apart from each other;
   a plurality of light source packages on the surface of the substrate, the light source packages being positioned between the two light barriers of the plurality of light barriers; and
   a total-reflection induction layer having a first surface on the plurality of light source packages and in contact with the surface of the substrate, the total-reflection induction layer extending between adjacent ones of the plurality of light source packages, the total-reflection induction layer having a flat surface that is opposite the first surface on the plurality of light source packages, the total-reflection induction layer being disposed between the light source packages with respect to a first direction, and the light source packages and the total-reflection induction layer being disposed between the light barrier in a second direction perpendicular to the first direction.

2. The light source module according to claim 1, wherein the plurality of light barriers include a white organic material.

3. The light source module according to claim 2, wherein the plurality of light barriers include at least one of: polycarbonate (PC), ethylene naphthalate (PEN), polyimide (PI), polyethersulfone (PES), polyethylene terephthalate (PET), polymethyl methacrylate (PMMA), or polystyrene (PS).

4. The light source module according to claim 1, wherein the total-reflection induction layer includes a clear organic material.

5. The light source module according to claim 4, wherein the clear organic material includes at least one of an optical clear adhesive or an optical clear resin.

6. The light source module according to claim 1, wherein a distance from the surface of the substrate to the flat surface of the total-reflection induction layer is equal to, or less than, a distance from the surface of the substrate to an opposite surface of the plurality of light barriers.

7. The light source module according to claim 1, wherein the plurality of light source packages include:
   a plurality of light source chips on the surface of the substrate; and
   a phosphor layer that surrounds the respective light source chips.

8. The light source module according to claim 1, wherein the total-reflection induction layer has a refractive index that is greater than a refractive index of the plurality of light barriers.

9. A backlight unit, comprising:
   a light source module including:
   a substrate having a surface;
   a plurality of light barriers on the surface of the substrate and spaced apart from each other;
   a plurality of light source packages on the surface of the substrate, the light source packages being positioned between the two light barriers of the plurality of light barriers;

a total-reflection induction layer having a first surface on the plurality of light source packages, the total-reflection induction layer extending between and in contact with respective sidewalls of adjacent ones of the plurality of light source packages, the total-reflection induction layer having a flat surface that is opposite the first surface on the plurality of light source packages, the total-reflection induction layer being disposed between the light source packages with respect to a first direction, and the light source packages and the total-reflection induction layer being disposed between the light barrier in a second direction perpendicular to the first direction;

a light guide plate positioned adjacent to the flat surface of the total-reflection induction layer; and a receiving member that receives the light source module and the light guide plate.

10. The backlight unit according to claim 9, wherein a surface of the light guide plate adjacent to the flat surface of the total-reflection induction layer is in contact with at least one of the plurality of light barriers or the total-reflection induction layer.

11. The backlight unit according to claim 9, wherein the plurality of light barriers include a white organic material.

12. The backlight unit according to claim 11, wherein the plurality of light barriers include at least one of: polycarbonate (PC), ethylene naphthalate (PEN), polyimide (PI), polyethersulfone (PES), polyethylene terephthalate (PET), polymethyl methacrylate (PMMA), or polystyrene (PS).

13. The backlight unit according to claim 9, wherein the total-reflection induction layer includes a clear organic material.

14. The backlight unit according to claim 13, wherein the clear organic material includes at least one of an optical clear adhesive or an optical clear resin.

15. The backlight unit according to claim 9, wherein a distance from the surface of the substrate to the flat surface of the total-reflection induction layer is equal to, or less than, a distance from the surface of the substrate to an opposite surface of the plurality of light barriers.

16. The backlight unit according to claim 9, wherein the plurality of light source packages include:
    a plurality of light source chips on the surface of the substrate; and
    a phosphor layer that surrounds the respective light source chips.

17. The backlight unit according to claim 9, wherein the total-reflection induction layer has a refractive index that is greater than a refractive index of the plurality of light barriers.

18. The backlight unit according to claim 9, wherein the total-reflection induction layer has a refractive index that is greater than a refractive index of the light guide plate.

19. A method of making a light source module, comprising:
    positioning a plurality of light barriers on a surface of a substrate, the plurality of light barriers being spaced apart from each other;
    positioning a plurality of light source packages on the surface of the substrate and between the plurality of light barriers; and
    forming a total-reflection induction layer on the plurality of light source packages, the total-reflection induction layer extending between and in contact with respective sidewalls of adjacent ones of the plurality of light source packages, the total-reflection induction layer having a flat surface opposite the plurality of light source packages.

20. The method of claim 19, wherein the total-reflection induction layer is formed to have a distance from the surface of the substrate to the flat surface of the total-reflection induction layer that is equal to or less than a distance from the surface of the substrate to an opposite surface of the plurality of light barriers.

21. The light source module according to claim 1, wherein the total-reflection induction layer contacts at least three surfaces of each of the plurality of light source packages.

22. The backlight unit according to claim 9, wherein the total-reflection induction layer contacts at least five surfaces of each of the plurality of light source packages.

* * * * *